United States Patent
Ostrem et al.

(10) Patent No.: US 6,172,307 B1
(45) Date of Patent: *Jan. 9, 2001

(54) FEEDTHROUGH VIA CONNECTION ON SOLDER RESISTANT LAYER

(75) Inventors: Fred E. Ostrem, Long Grove; Alfred G. Ocken, Palatine, both of IL (US)

(73) Assignee: Motorola, Inc., Schaumburg, IL (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

This patent is subject to a terminal disclaimer.

(21) Appl. No.: 08/410,616

(22) Filed: Mar. 24, 1995

Related U.S. Application Data

(63) Continuation of application No. 08/024,046, filed on Mar. 1, 1993, now Pat. No. 5,416,278.

(51) Int. Cl.$^7$ ...................................................... H01R 9/09
(52) U.S. Cl. ............................ 174/263; 174/254; 174/255
(58) Field of Search .................................. 174/263, 262, 174/255, 254, 250; 361/748, 803, 767, 768; 29/830, 842; 257/720

(56) References Cited

U.S. PATENT DOCUMENTS

| | | | |
|---|---|---|---|
| 3,844,831 | 10/1974 | Cass et al. | 117/212 |
| 3,888,639 | 6/1975 | Hastings et al. | 29/626 |
| 4,713,494 | 12/1987 | Oikawa et al. | 174/68.5 |
| 5,079,065 | 1/1992 | Masakazu et al. | 428/137 |
| 5,084,323 | 1/1992 | Nagasaka et al. | 428/137 |
| 5,223,672 | * 6/1993 | Pinneo et al. | 174/52.4 |
| 5,263,243 | 11/1993 | Taneda et al. | 29/830 |
| 5,311,404 | * 5/1994 | Trask et al. | 361/762 |
| 5,416,278 | * 5/1995 | Ostrem et al. | 174/263 |

* cited by examiner

*Primary Examiner*—Jeffrey Gaffin
*Assistant Examiner*—Kamand Cuneo
(74) *Attorney, Agent, or Firm*—Simon Anolick

(57) ABSTRACT

A method for constructing a feedthrough via connection and a corresponding apparatus includes a metallic plate (101), or rigidizer, preferably composed of an aluminum material. A solderable contact area (103), is located on the plate (101). This contact area (103) is preferable comprised of a copper material selectively disposed by a plasma spraying process. Next, an electrically insulating adhesive layer (105) is disposed onto the plate (101). This adhesive layer (105) has a feedthrough via (106) disposed therethrough aligned with the contact area (103). Then, a substrate (109), preferably composed of a flexible composite polyimide material, is disposed onto the adhesive layer (105). This flexible substrate (109) has a via (110) disposed therethrough with a solderable area (111) disposed thereon. Then, a quantity of solder (113) is disposed onto the solderable area (111), and the assembly (100) is heated so that the solder (113) flows into the vias (106) and (110), thereby providing an electrical connection including the solderable area (111) of the via (110), the solder (113), and the contact area (103). During this reflow step, the structure of the adhesive layer (105) acts as a soldermask preventing the solder (113) from flowing outside of an area defined by the via (106).

6 Claims, 1 Drawing Sheet

FEEDTHROUGH VIA CONNECTION ON SOLDER RESISTANT LAYER

This is a continuation of application Ser. No. 08/024,046, filed Mar 1, 1993 now U.S. Pat No. 5,416,278.

FIELD OF THE INVENTION

The present invention relates to electronic module assemblies, and particularly to the type of module assembly that includes a substrate both electrically and mechanically connected to a heatsink.

BACKGROUND OF THE INVENTION

In the field of packaging of electric components onto a substrate, it is frequently desirable to provide an electrical connection between some of these components and a heatsink. This may be to facilitate the conduction of a significant current, or for using the heatsink as an electromagnetic interference shield. Typically, the components are mounted onto a substrate that is disposed on the heatsink. Prior art schemes have been divised to electrically connect the pertinent electrical components located on the substrate and the heatsink.

One scheme relies on electrically connecting certain electrical components located on the substrate with the heatsink using aluminum wire bonds. This requires the disposal of a bonding pad onto the substrate. Then an aluminum wire is ultrasonically bonded between the heatsink and the bonding pad. This connection scheme is undersirably expensive and difficult to manufacture. Also, it has undesirable electrical performance because of the wire bond's electrical performance at high frequencies. Further, it is unreliable in applications with a severe vibration environment.

Another prior art scheme applies a metal post inserted into a metal baseplate and extending through a solderable feedthrough via in a substrate. In this scheme it is difficult to reliably solder the pin to the solderable via, is costly because of a seperate post, and is generally difficult to manufacture.

A connection approach that is reliable, easily assembled, and less expensive is clearly needed.

DETAILED DESCRIPTION OF A PREFERRED EMBODIMENT

Figure 1:
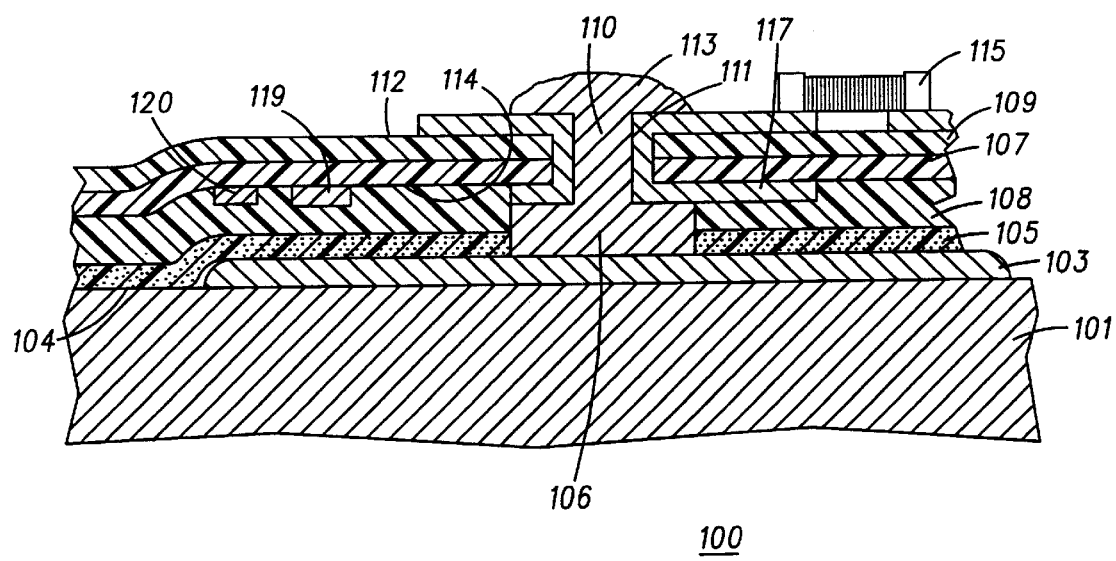
FIG. 1 is a cross-sectional diagram of an improved structure, in accordance with the invention.

In FIG. 1 a cross-sectional diagram of a circuit substrate disposed onto an aluminum substrate is shown. An assembly method to manufacture this structure will be detailed as follows. This assembly includes a metallic plate, or rigidizer, 101. This plate 101, may be used as a heatsink. In this case, an aluminum material is used. Of course any other electrically conductive, heat spreading material, may be substituted for the aluminum if desired. Preferably, the aluminum plate 101 is substantially planar.

A copper layer, or other solderable metal, is disposed onto a top surface 104 of the aluminum plate 101, confined to selective areas, forming solderable contact areas 103. These selective areas 103 represent areas that will be used to facilitate an electrical connection. This copper layer may either be plasma sprayed, or deposited onto the aluminum plate 101 using another technique. Those skilled in the art will recognize other materials and application process such as electroplated tin, plasma sprayed tin, electroplated silver, plasma sprayed silver, plasma sprayed nickel, and electroless nickel, that may be substituted for the copper material and plasma spraying process in this step. A plasma sprayed deposition process is a standard commercial process. With the use of a mask, or stencil, various patterns, of predetermined sizes, may be deposited onto the aluminum plate 101. This deposition step is necessary when using an aluminum plate because aluminum is not practically solderable. Alternatively, if the plate 101 is composed of a solderable material, such as copper, this separate deposition step may not be necessary. In this case the plate 101 and the solerable contact areas 103 would be both be comprised of copper.

Next, an electrically insulating adhesive layer 105 is applied to the aluminum plate 101. This adhesive layer 105 preferably is composed of an acrylic or silicone based material. It is applied to the copper free areas on a top surface 104 of the aluminum plate 101 and portions of the solderable contact areas 103. When using a pressure sensitive adhesive for layer 105 a sheet is first blanked with holes, or feedthrough vias, 106 corresponding to the position of the solderable contact areas 103. Note that only one such via is shown in FIG. 1. These feedthrough vias are sized smaller than the solderable contact areas 103 to effectively captivate solder to be applied later. This electrically insulating adhesive layer 105 is then disposed onto the aluminum plate 101. The feedthrough vias 106 are positioned aligned with and exposing the corresponding solderable contact areas 103. The feedthrough vias 106 allow the passage of solder 113 to the solderable contact areas 103. This adhesive layer 105 has several functions. These include provision of an electrically insulating dielectric barrier between the aluminum plate 101 and a to be provided circuit substrate, an adhesive function to bond the selectively exposed aluminum plate 101 and the to be provided circuit substrate, and a structure to mask the flow of the solder material 113 to be applied later. Without the structure to mask limit the flow of the solder 113, it would flow unrestricted outside the solderable contact areas 103, potentially lifting off the circuit substrate to be applied later. Because of the construction of this electrically insulating adhesive layer 105 and the corresponding feedthrough vias the to be applied solder will be captivated within the feedthrough vias 106.

Next, a flexible circuit substrate 107, 108 and 109, in this case composed of a composite polymide material, is disposed onto the adhesive layer 105. Those skilled in the art will recognize that a rigid substrate may also be used in place of the flexible substrate. Element 107 corresponds to a bottom layer of the composite polyimide substrate and element 109 corresponds to a top layer of the composite polymide substrate. Element 108 is an optional coverlay attached to the bottom layer 107 to add additional electrical isolation between a multiplicity of separated conductive traces 119, 120 and the aluminum plate 101. This additional isolation may not be required in all cases. This flexible substrate, comprised of layers 107, 108, and 109, is fabricated separately and is typically joined by a pressure sensitive adhesive. The flexible substrate 107, 108, and 109 also has via 110 disposed therethrough extending from a first side 112 to a second side 114. This via 110 is position aligned with the corresponding feedthrough via 106 and the solderable contact area 103. Optionally, if the coverlay layer 108 is attached, then the via 110 also extends through the coverlay layer 108. Further, via 110 has a solderable area 111 disposed thereon extending from the first side 112 to the second side 114 of the substrate extending to a conductive trace 117. If the coverlay layer 108 is present, then the solderable area 111 does not extend through the coverlay's via.

Next, solder 113, typically in the form of a solder paste—the quantity being sufficient to fill the vias 106 and 110, is disposed on top of the solderable area 111, along with electrical components represented by reference number 115.

Next, the complete assembly 100 is heated in a reflow oven such that the solder 113 flows into the vias 106 and 110, thereby providing an electrical connection including the solderable area 111, the solder 113, and the solderable contact areas 103. During this reflow step, the structure of the adhesive layer 105, prevents the solder 113 from flowing outside of an area defined by the via 106.

This new structure has many advantages over prior art connection schemes. For instance, it provides a more reliable connection than an aluminum wirebond. Also, its performance in a hostile vibration environment is clearly superior because of the solid nature of its structure. Further, a soldering process is easier to control than a wire bonding process, and the resulting structure is more permanent and robust. This approach also provides a better high frequency electrical connection, has a lower manufacturing cost and is easy to assemble. Also, the coverlay 108 and/or the electrically insulating adhesive layer 105 electrically isolate traces 119 and 120 from the aluminum plate 101.

Although a particular assembly is shown in the preferred embodiment, other laminated structures may take advantage of this new approach. For example these may include connector assemblies.

What is claimed is:

1. A feedthrough via connection comprising:
    a solder-resistant metallic plate having a contact area selectively disposed in direct contact therewith and wherein solder adheres to at least a portion of the contact area;
    a substrate having a via disposed therethrough extending from a first side to a second side thereof and wherein the via including a surface formed on the substrate to which solder will adhere, the substrate positioned aligned with the solderable contact area of the solder-resistant metallic plate; and
    solder disposed extending through the via to the contact area of the solder-resistant metallic plate and adhering to at least a portion of the contact area of the via on the substrate.

2. A connection in accordance with claim 1 wherein the substrate comprises a flexible substrate.

3. A feedthrough connection a solder-resistant metallic plate having a contact area selectively disposed in direct contact therewith and wherein solder adheres to at least a portion of the contact area;
    a substrate having a via disposed therethrough extending from a first side to a second side thereof and wherein the having an area to which solder will adhere, the substrate positioned aligned with the solderable contact area of the solder-resistant metallic plate;
    solder disposed extending through the via to the contact area of the solder-resistant metallic plate and adhering to at least a portion of the contact area and the area of the via; and
    wherein the substrate has a multiplicity of separated conductive traces disposed on a surface which is electrically isolated from the solder-resistant metallic plate by an electrically insulating coverlay.

4. A feedthrough via connection comprising:
    a substantially planar aluminum rigidizer having a top surface;
    a plasma sprayed copper layer selectively disposed in direct contact with the top surface of the substantially planar aluminum rigidizer forming a contact area to which solder will adhere;
    a substrate having a via disposed therethrough extending from a from a first side to a second side thereof wherein the via having an area to which solder will adhere, the substrate positioned aligned with the solderable contact area of the plasma sprayed copper layer; and solder disposed extending from the via to the contact area of the solder-resistant metallic plate and adhering to the contact area to the area in the via.

5. A connection in accordance with claim 4 wherein the substrate comprises a flexible substrate.

6. A connection in accordance with claim 5 wherein the substrate has a multiplicity of seperated conductive traces disposed on a surface which is electrically isolated from the solder-resistant metallic plate by a electrically insulating coverlay.

* * * * *